(12) United States Patent
Ogawa et al.

(10) Patent No.: US 7,670,031 B2
(45) Date of Patent: Mar. 2, 2010

(54) LIGHTING DEVICE AND DISPLAY APPARATUS

(75) Inventors: Yoichi Ogawa, Ibaraki (JP); Masataka Sato, Ibaraki (JP); Katsusuke Shimazaki, Ibaraki (JP); Eiji Koyama, Ibaraki (JP); Hiroyuki Tsukamoto, Ibaraki (JP); Toshihiro Yamanaka, Ibaraki (JP)

(73) Assignee: Hitachi Maxell, Ltd., Ibaraki-shi (JP)

( * ) Notice: Subject to any disclaimer, the term of this patent is extended or adjusted under 35 U.S.C. 154(b) by 147 days.

(21) Appl. No.: 11/878,545

(22) Filed: Jul. 25, 2007

(65) Prior Publication Data

US 2008/0030986 A1 Feb. 7, 2008

(30) Foreign Application Priority Data

Aug. 3, 2006 (JP) ............................. 2006-212084
Jun. 18, 2007 (JP) ............................. 2007-160114

(51) Int. Cl.
*F21V 5/00* (2006.01)
(52) U.S. Cl. ........................... 362/311.02; 362/311.01; 362/311.03
(58) Field of Classification Search .............. 315/185 S; 313/498, 110; 250/552, 553; 362/311, 800, 362/310, 351, 311.01, 311.02, 311.03, 311.06, 362/311.05
See application file for complete search history.

(56) References Cited

U.S. PATENT DOCUMENTS

| | | | | |
|---|---|---|---|---|
| 4,675,575 A * | 6/1987 | Smith et al. .............. 315/185 S |
| 5,959,316 A * | 9/1999 | Lowery ........................ 257/98 |
| 6,155,699 A * | 12/2000 | Miller et al. ................ 362/293 |
| 6,686,676 B2 * | 2/2004 | McNulty et al. ............ 313/112 |
| 6,707,069 B2 * | 3/2004 | Song et al. .................... 257/79 |
| 6,982,522 B2 * | 1/2006 | Omoto ....................... 313/502 |
| 7,591,568 B2 * | 9/2009 | Park et al. .............. 362/311.01 |
| 2007/0153527 A1 * | 7/2007 | Van Dyn Hoven .......... 362/311 |
| 2007/0268694 A1 * | 11/2007 | Bailey et al. ................ 362/231 |
| 2008/0173889 A1 * | 7/2008 | Shylo et al. ................... 257/98 |

FOREIGN PATENT DOCUMENTS

| JP | A 2000-004050 | 1/2000 |
| JP | A 2005-064111 | 3/2005 |
| JP | A 2005-158773 | 6/2005 |

* cited by examiner

*Primary Examiner*—Jacob Y Choi
(74) *Attorney, Agent, or Firm*—Oliff & Berridge, PLC

(57) ABSTRACT

A lighting device includes a plurality of self-luminous elements formed on a substrate and emitting different wavelengths of light from each other, a hemispherical lens structure formed on the substrate to cover the self-luminous elements, and a plurality of translucent spherical particles covering a surface of the lens structure. Light emitted from the self-luminous elements passes through the lens structure and enters the translucent spherical particles where its direction is largely inclined to scatter due to a difference in refractive index between the translucent spherical particles and air. Consequently, different wavelengths of light from the self-luminous elements are mixed to produce a desired color of light.

10 Claims, 9 Drawing Sheets

LIGHTING DEVICE AND DISPLAY APPARATUS

BACKGROUND OF THE INVENTION

1. Field of the Invention

The present invention relates to a lighting device and a display apparatus using the same.

2. Description of Related Art

Self-luminous elements such as a LED (Light Emitting Diode) and an organic EL (Electro Luminescence) are currently at an advanced stage of development, so that they have the same level of energy efficiency as a fluorescent lamp. The use for such self-luminous elements as lightings to replace existing lightings such as an incandescent lamp and a fluorescent lamp according to their characteristics has been contemplated. Because most lightings are used as a white light source, it is necessary to produce white light when using a self-luminous element as well.

However, a self-luminous element normally can emit light in a very narrow wavelength range only. One approach to obtain white light from such a self-luminous element is to mix light with different wavelengths or colors. This technique has the advantage of excellent color reproducibility through adjustment of the light intensity of each wavelength but also has the disadvantage of difficulty in mixing light in a small space to cause an increase in the size of a lighting device.

Japanese Unexamined Patent Application Publication No. 2000-4050 discloses an illuminant that is capable of emitting light in many directions by covering the surface of a LED with a number of beads.

As described above, the technique of mixing light with different wavelengths for the purpose of obtaining a desired color of light using a self-luminous element has the problem that it is difficult to mix light in a small space, which causes a larger lighting device.

SUMMARY OF THE INVENTION

The present invention has been accomplished to solve the above problem and an object of the present invention is thus to provide a small, light-weight lighting device that mixes two or more light source colors in a small space to obtain a desired color of light, and a display apparatus using the same.

According to an aspect of the present invention, there is provided a lighting device including a plurality of self-luminous elements formed on a substrate and emitting different wavelengths of light from each other, a hemispherical lens structure formed on the substrate to cover the self-luminous elements, and a plurality of translucent spherical particles covering a surface of the lens structure.

The present invention can provide a small, light-weight lighting device that mixes two or more light source colors in a small space to produce a desired color of light, and a display apparatus using the same.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

An embodiment of the present invention is described hereinafter. The present invention, however, is not limited to the embodiments described below. The following description and the accompanying drawings are appropriately omitted or simplified to clarify the explanation.

First Embodiment

Figure 1A:
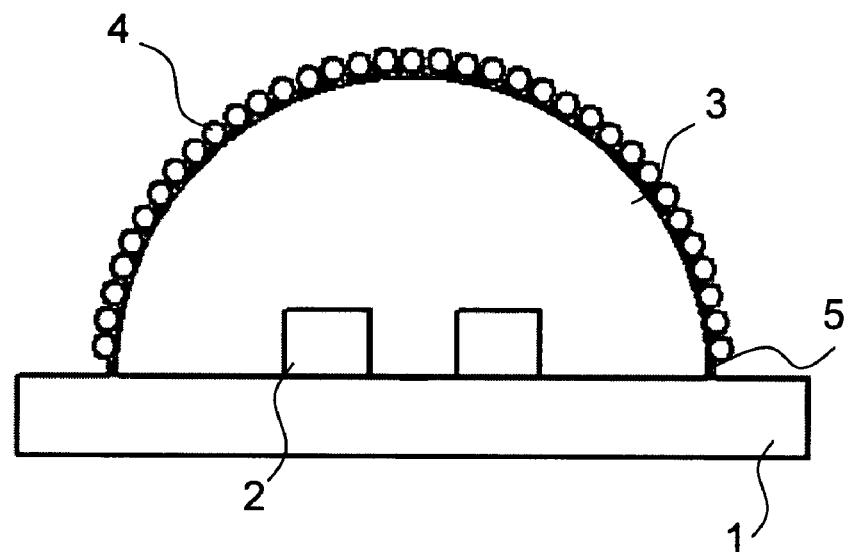
FIGS. 1A and 1B are schematic views showing an exemplary structure of a lighting device according to an embodiment the present invention.
Figure 1B:
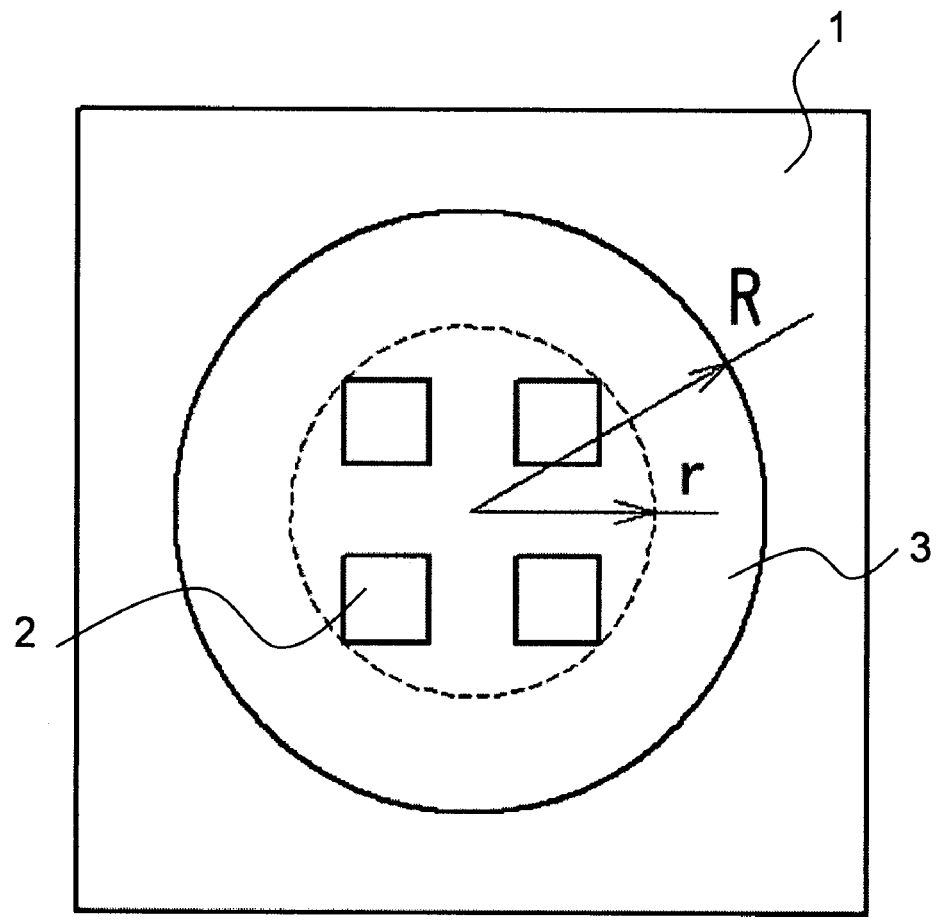

FIGS. 1A and 1B show a typical structure of a lighting device according to an embodiment of the present invention. The lighting device includes a substrate 1, light emitting elements 2, a lens structure 3, translucent spherical particles 4, and an adhesive layer 5. FIG. 1A is a schematic sectional view of the lighting device, and FIG. 1B is a plan view showing the positional relationship of the substrate 1, the light emitting elements 2 and the lens structure 3.

The lighting device of this embodiment is suitable for use as a backlight of a liquid crystal display apparatus. The present invention allows a decrease in the size of a backlight, thus enabling the achievement of a small, light-weight liquid crystal display apparatus.

A plurality of light emitting elements 2 are formed on the substrate 1. The light emitting element 2 is a self-luminous element for spot or surface light emission, and a LED (Light Emitting Device), an organic EL (Electro Luminescence), an inorganic EL and so on may be used, for example.

A plurality of light emitting elements 2 are placed in order to mix different wavelengths or colors of light to produce a desired color of light. At least two colors of light are emitted from the light emitting elements 2. Specifically, a desired color may be obtained by mixing Red (R), Green (G) and Blue (B) light, which are three primary colors of light, but it is not limited thereto.

The lens structure 3 is made of translucent resin, glass or the like and has a hemispherical shape to cover the light emitting element 2. Although the "hemisphere" in a mathematical term is one of two parts of a sphere being divided at a plane passing through the center of the sphere, the term "hemisphere" used in the present invention is not necessarily a complete hemisphere and it includes a semi-elliptic shape close to a hemispherical shape, one of two parts of a sphere being divided at a plane passing through the vicinity of the center of the sphere, a polyhedron that is a diamond-cut hemisphere, a combination of a hemisphere and a cylinder, and other shapes close to a hemisphere.

The light emitting elements 2 are preferably gathered in close proximity to the focal point of the lens structure 3. Particularly, it is preferred to satisfy R/r>1.8 where the light emitting elements 2 are placed in a circular area with a radius of r, the lens structure 3 has a spherical surface with a radius of R. The reason is described in detail in Examples below. In such a configuration, light from each light emitting element 2 is incident on the surface of the lens structure 3 at a substantially right angle, thereby preventing total reflection so as to improve the efficiency to extract light to the outside.

The translucent spherical particles 4 are fixed to the lens structure 3 through the transparent adhesive layer 5. The translucent spherical particles 4 are formed to cover the surface of the lens structure 3 with substantially no space therebetween. The translucent spherical particles 4 are beads which are made of transparent resin or glass. As the refractive index of the translucent spherical particles 4 is higher, the ability to scatter light increases, resulting in more suitable mixture of light colors.

If the translucent spherical particles 4 are formed in a single layer, it is fixed to the transparent adhesive layer 5 by being partly buried therein. If the proportion of the part of the translucent spherical particles 4 which is buried in the transparent adhesive layer 5 is large, a difference in refractive index between the translucent spherical particles 4 and its vicinity is small, which degrades the ability to scatter light. Therefore, the volume of the buried part is preferably as small as possible. Specifically, it is important to deposit the transparent adhesive layer 5 as thin as possible while ensuring the function of adhering to the translucent spherical particles 4. The refractive index of the transparent adhesive layer 5 is preferably close to the refractive index of air. The surface of the translucent spherical particles 4 may be covered with a thin transparent coating, which does not cause a significant difference in its ability.

Figure 4:
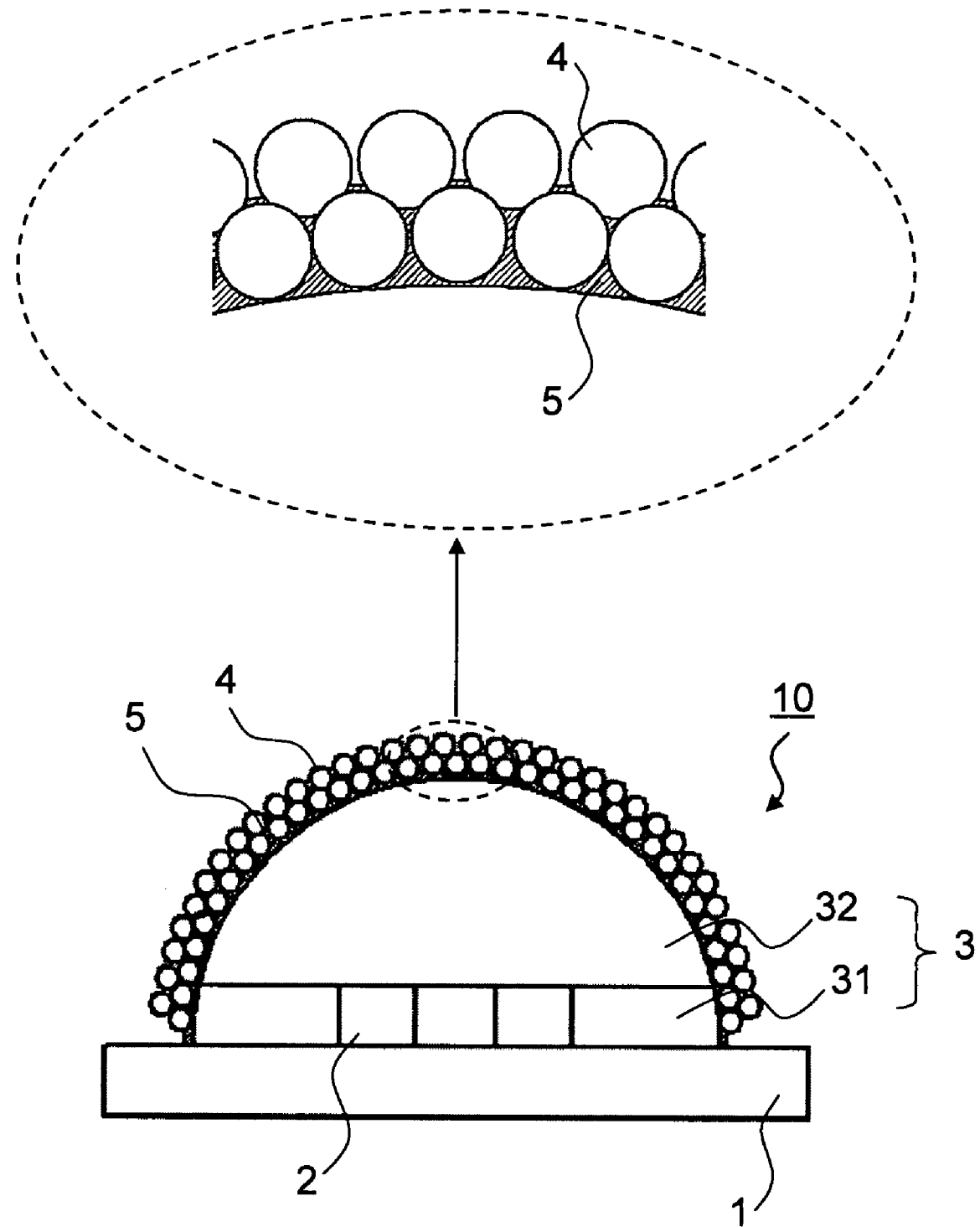
FIG. 4 is a schematic sectional view showing a lighting device according to Example 2.

The translucent spherical particles 4 may be formed in a double layer structure. If the translucent spherical particles 4 are formed in a single layer structure, a space still exists even if the translucent spherical particles 4 are arranged on the surface of the lens structure 3 in close proximity to each other. The light leaks outside through the space without passing through the translucent spherical particle 4, thus without being refracted. As a result, a part of light is not mixed. In the double layer structure, the translucent spherical particles 4 in the second layer can be placed on the space which exists in the first layer, which enhances the scattering of light to enable more suitable mixture of light colors. The translucent spherical particles 4 are preferably exposed from the transparent adhesive layer 5 as much as possible when the translucent spherical particles 4 have the double layer structure as well. Referring to FIG. 4, the translucent spherical particles 4 in the first layer are entirely buried in the adhesive layer 5, and the translucent spherical particles 4 in the second layer are mostly exposed outside. However, it is preferred that the translucent spherical particles 4 in the first layer are also exposed partly. Because three or more layers of the translucent spherical particles 4 causes degradation of the light extraction efficiency, the single or double layer structure is preferred.

When using the singe layer structure, it is preferred to use the translucent spherical particles 4 in which the particle size distribution has two or more peaks. In such a case, a minimum peak value of the particle size distribution is set to ½ or lower relative to a maximum peak value of the particle size distribution, so that a translucent spherical particle with the minimum peak value is placed between translucent spherical particles with the maximum peak value, thus filling the space between large translucent spherical particles. It is thereby possible to obtain the function close to that of the dual layer structure with the use of the single layer structure.

The function of the lighting device of this embodiment is described hereinafter. Light emitted from the light emitting element 2 passes through the lens structure 3 and enters the translucent spherical particle 4 where its direction is largely inclined to scatter due to a difference in refractive index between the translucent spherical particle 4 and air. Consequently, different wavelengths of light from the light emitting elements 2 are mixed to become white light. If there is a space between adjacent translucent spherical particles 4, light emitted from the light emitting element 2 exits the lighting device without passing through the translucent spherical particle 4, which results in insufficient mixture of light. It is therefore important that the translucent spherical particles 4 cover the surface of the lens structure 3 without any space.

The present invention is described hereinafter in further detail with reference to several examples.

EXAMPLE 1

Figure 2:
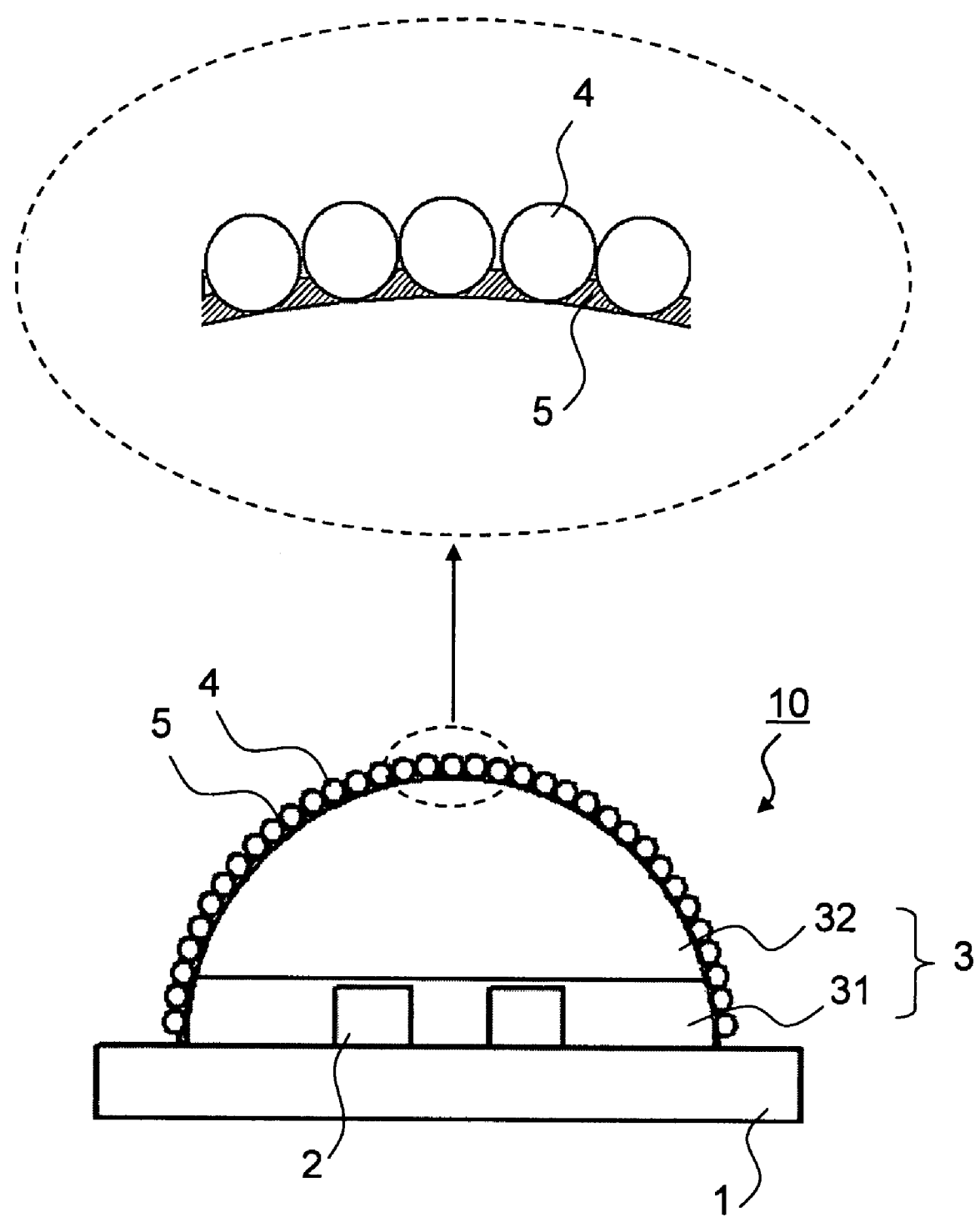
FIG. 2 is a schematic sectional view showing a lighting device according to Example 1.

FIG. 2 shows a schematic sectional view of a lighting device according to Example 1. Example 1 used three colors of LEDs, i.e. Red, Green and Blue, with outer dimensions of 0.3 mm*0.3 mm and a height of 0.1 mm as optical elements 2. Total four LEDs of one Red, two Greens and one Blue were placed on the substrate 1, which was made of silicon, at an interval of 0.3 mm as shown in FIG. 1B.

The four LEDs were sealed with a transparent silicon resin (LPS-5500 available from Shin-Etsu Chemical Co., Ltd) with a refractive index of 1.51 to form a sealing layer 31. Then, an acrylic hemispherical lens 32 with a refractive index of 1.49 and a radius of R was placed on the sealing layer 31 as shown in FIG. 2. The sealing layer 31 and the acrylic hemispherical lens 32 constitute the hemispheric lens structure 3. The transparent adhesive layer 5 was sprayed, with a thickness of about 5 μm, onto the surface of the lens structure 3 using a mask to prevent the transparent adhesive from being attached to another part. Before the transparent adhesive layer 5 was dried, the translucent spherical particles 4, which were glass beads with a diameter of about 30 μm and a refractive index of 1.93, were pressed against the layer, so that they were attached to cover the surface of the lens structure 3 with no space therebetween. A lighting unit 10 shown in FIG. 2 was thereby manufactured.

Figure 3:
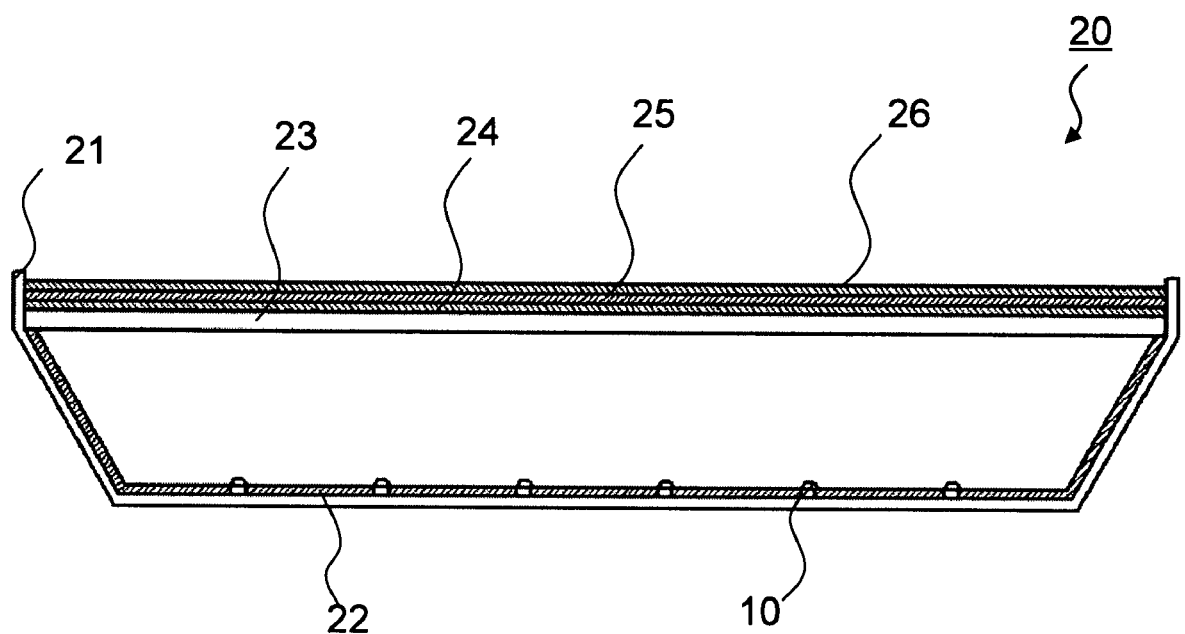
FIG. 3 is a schematic sectional view showing a lighting device according to Examples 1 to 3 and Comparative examples 1 to 2.

Referring next to FIG. 3, total 18 units of the lighting units 10 with three columns and six rows were arranged at an interval of 3 cm within a casing 21, and a part where the lighting unit 10 did not exist within the casing 21 was covered with a white reflective film 22 with a reflectivity of 96%. Further, a diffusion plate 23 was placed on a light emission opening of the casing 21, and a diffusion film 24, a light condensing film 25 and a light condensing film 26 were placed sequentially thereon. A lighting device 20 was thereby manufactured. GM2 available from KIMOTO was used as the diffusion film 24, BEF-II available from Sumitomo 3M Limited was used as the light condensing film 25, and DBEF available from Sumitomo 3M Limited was used as the light condensing film 26. The luminance characteristics of the lighting device 20 were measured.

Figure 9:
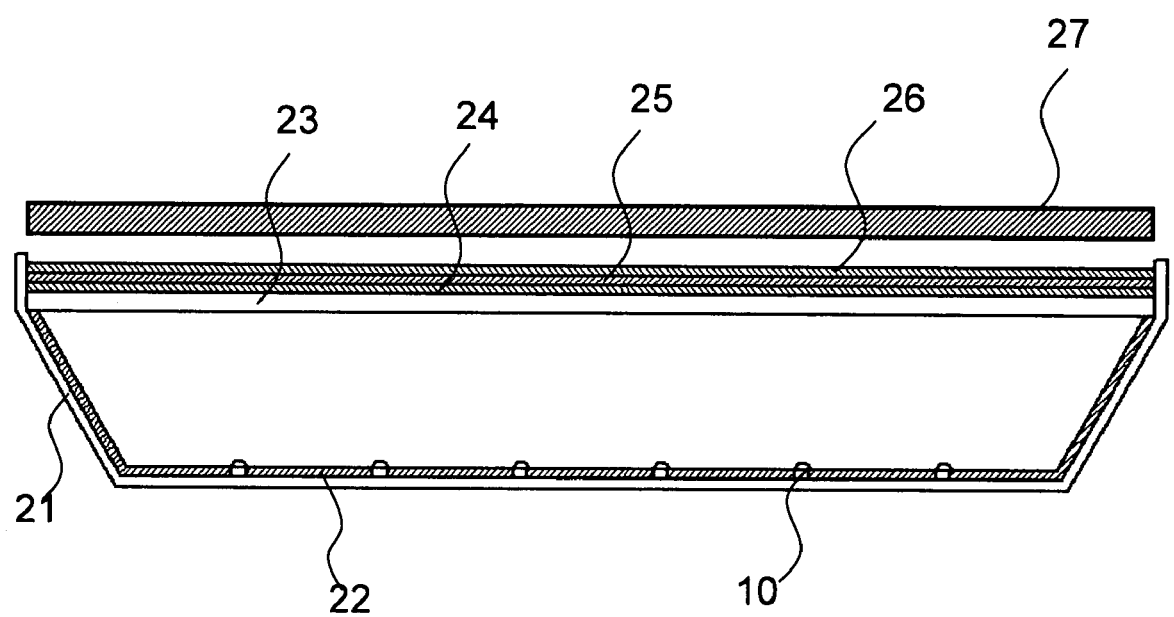
FIG. 9 is a schematic sectional view showing a liquid crystal display apparatus using a lighting device according to an embodiment of the present invention.

In the measurement of the luminance characteristics, the power to be applied to the three colors (Red, Green and Blue) of LEDs was adjusted in such a way that the color of the lighting device was almost white. The lighting device was used as a backlight. Specifically, a liquid crystal panel 27 was mounted as shown in FIG. 9, and the availability of the lighting device as a liquid crystal backlight was confirmed.

Further, with the use of the lighting device, the color when changing the power to be applied to be the LEDs from the power for producing white by cutting 50 percent of power to Green LED and the color when changing it by cutting 50 percent of power to Blue LED were measured.

EXAMPLE 2

FIG. 4 is a schematic sectional view of a lighting device according to Example 2. As shown in FIG. 4, in a lighting unit 10 of this example, the outer surface of the lighting unit 10 of Example 1 was further covered with the translucent spherical particles 4 which were used in Example 1, so that the translucent spherical particles 4 had a double layer structure. Apart from the above, the lighting unit 10 of this example was manufactured in the same manner as the lighting unit 10 of Example 1.

When forming the translucent spherical particles 4 in the second layer, a transparent adhesive was sprayed onto the translucent spherical particles 4 in the first layer with a thickness which entirely covered the first layer using a mask. Before the transparent adhesive layer 5 was dried, the translucent spherical particles 4 were attached so as to cover the surface of the acrylic hemispherical lens 32 with no space therebetween.

The lighting device 20 which was similar to that of Example 1 was manufactured using the lighting unit 10, and its luminance characteristics were measured.

EXAMPLE 3

Figure 5:
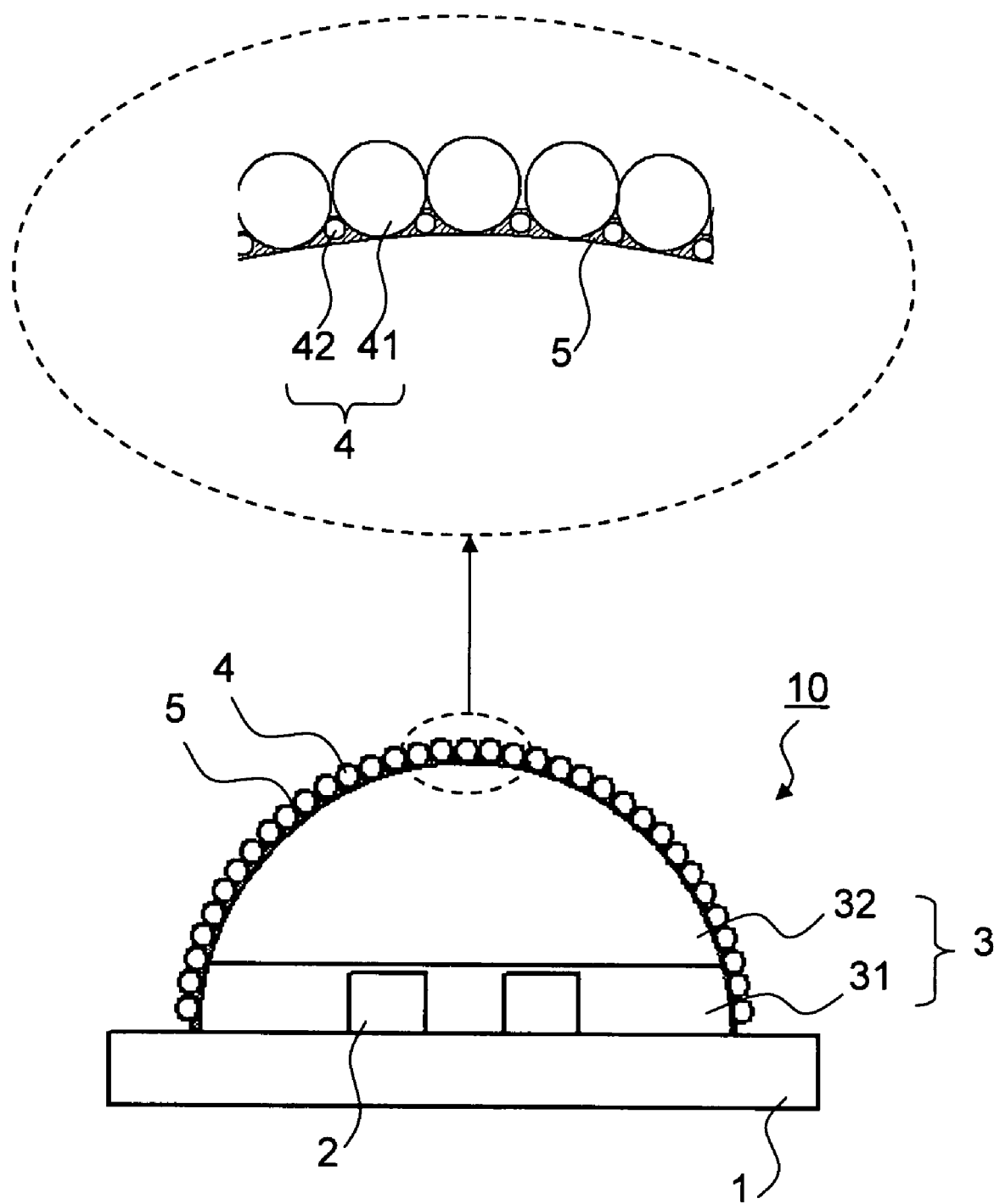
FIG. 5 is a schematic sectional view showing a lighting device according to Example 3.

FIG. 5 is a schematic sectional view of a lighting device according to Example 3. As shown in FIG. 5, the translucent spherical particles 4 are composed of translucent spherical particles 41 and 42, which are glass beads having two peaks in the particle size distribution. Specifically, the combination of substantially the same number of the translucent spherical particles 41 with a diameter of about 30 μm and a refractive index of 1.93 and the translucent spherical particles 42 with a diameter of about 10 μm and a refractive index of 1.93 was attached to the surface of the lens structure 3. Apart from the above, the lighting unit 10 of this example was manufactured in the same manner as the lighting unit 10 of Example 1.

The lighting device 20 which was similar to that of Example 1 was manufactured using the lighting unit 10, and its luminance characteristics were measured.

EXAMPLE 4

Figure 8A:
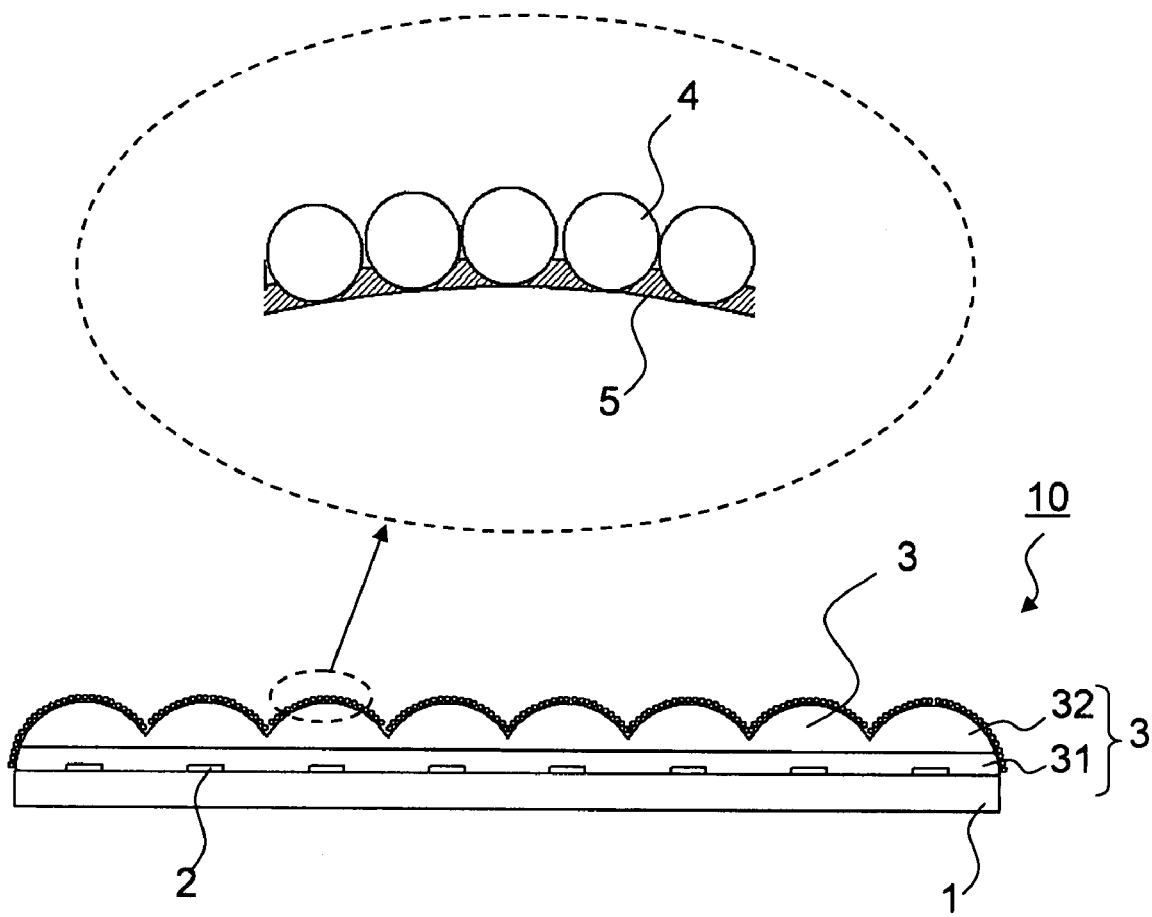
FIGS. 8A and 8B are schematic views showing a lighting device according to Example 4.
Figure 8B:
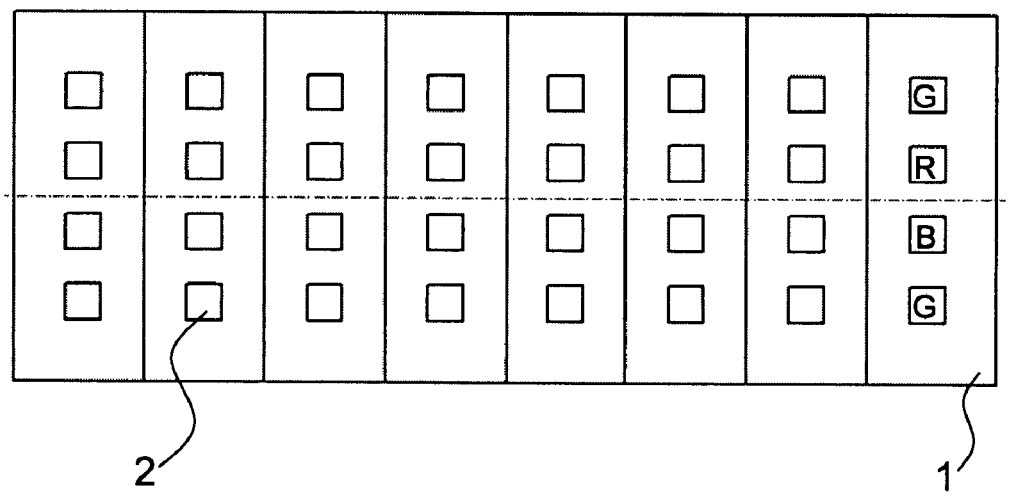

FIG. 8A is a schematic sectional view of a lighting device according to Example 4. Three colors of LEDs, i.e. Red, Green and Blue, with outer dimensions of 0.3 mm*0.3 mm and a height of 0.1 mm were used as optical elements 2. Total four LEDs of one Red, two Greens and one Blue were placed on the substrate 1, which was made of silicon, with eight columns at an interval of 0.3 mm as shown in FIG. 8B.

Then, the four LEDs were sealed with a transparent silicon resin (LPS-5500 available from Shin-Etsu Chemical Co., Ltd) with a refractive index of 1.51 to form a sealing layer 31. Then, acrylic hemispherical lenticular lenses 32, each with a refractive index of 1.49, a radius of 0.6 mm and a length of 3 mm, were placed on the sealing layer 31 at a pitch of 1 mm. The sealing layer 31 and the acrylic hemispherical lenticular lenses 32 constitute the hemispherical lens structure 3. The transparent adhesive layer 5 was sprayed, with a thickness of about 5 μm, onto the surface of the lens structure 3 using a mask to prevent the transparent adhesive from being attached to another part. Before the transparent adhesive layer 5 was dried, the translucent spherical particles 4, which were glass beads with a diameter of about 30 μm and a refractive index of 1.93, were pressed against the layer, so that they were attached to cover the surface of the lens structure 3 with no space therebetween. A lighting unit 10 was thereby manufactured.

Referring back to FIG. 3, total 18 units of the lighting units 10 with three columns and six rows were arranged at an interval of 3 cm within a casing 21, and a part where the lighting unit 10 did not exist within the casing 21 was covered with a white reflective film 22 with a reflectivity of 96%. Further, a diffusion plate 23 was placed on a light emission opening of the casing 21, and a diffusion film 24, a light condensing film 25 and a light condensing film 26 were placed sequentially thereon. A lighting device 20 was thereby manufactured. GM2 available from KIMOTO was used as the diffusion film 24, BEFII available from Sumitomo 3M Limited was used as the light condensing film 25, and DBEF available from Sumitomo 3M Limited was used as the light condensing film 26. The luminance characteristics of the lighting device 20 were measured.

COMPARATIVE EXAMPLE 1

The lighting device 20 was manufactured in the same manner as Example 1 except that the step of attaching the translucent spherical particles 4 onto the surface of the lens structure 3 was eliminated. The luminance characteristics of the lighting device 20 were measured.

COMPARATIVE EXAMPLE 2

Figure 6:
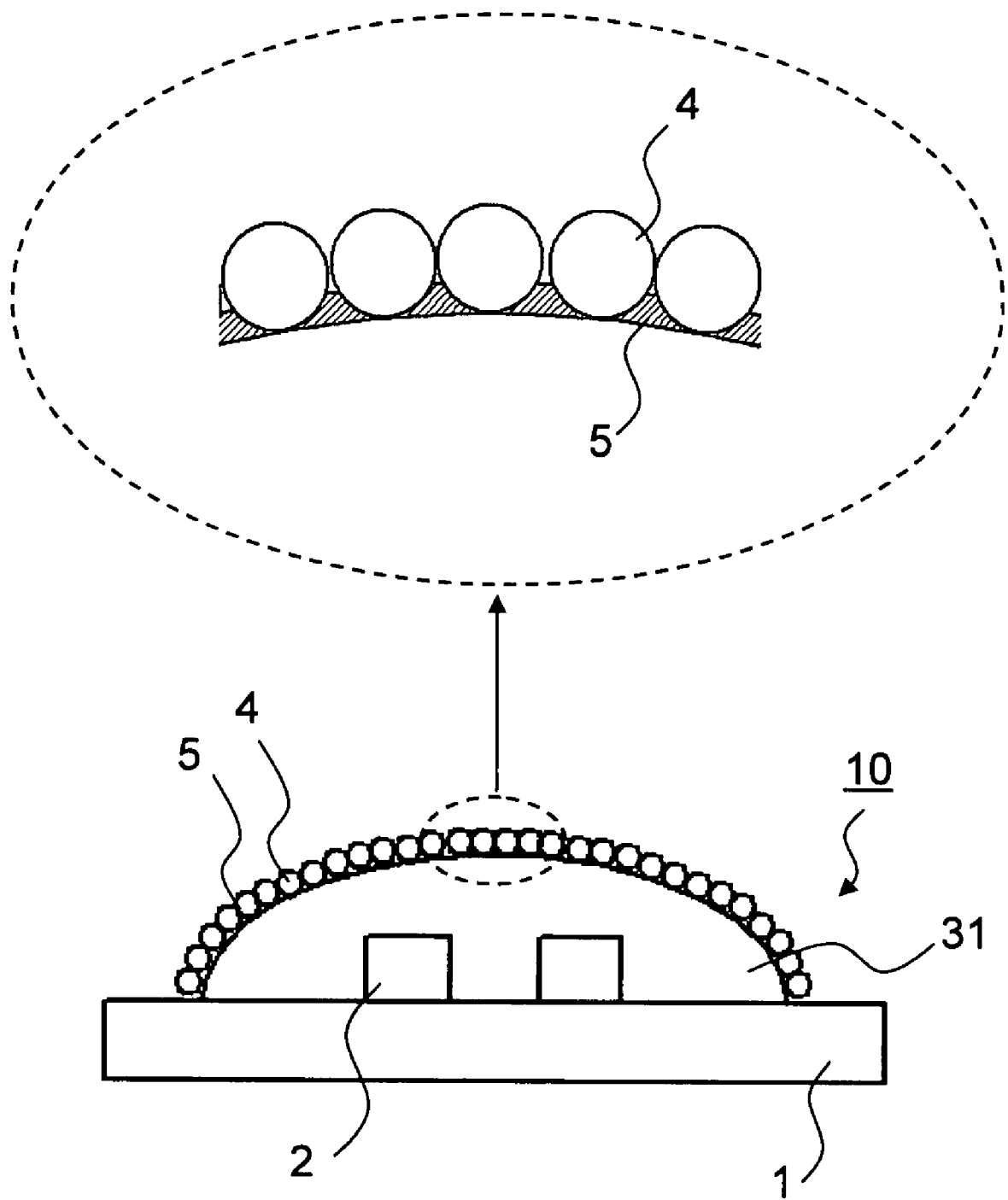
FIG. 6 is a schematic sectional view showing a lighting device according to Comparative example 2.

FIG. 6 is a schematic sectional view of a lighting device according to Comparative example 2. Three colors of LEDs, i.e. Red, Green and Blue, with outer dimensions of 0.3 mm*0.3 mm and a height of 0.1 mm were used as optical elements 2. Total four LEDs of one Red, two Greens and one Blue were placed on the substrate 1, which was made of silicon, at an interval of 0.3 mm as shown in FIG. 1B.

Then, the four LEDs were sealed with a transparent silicon resin (LPS-5500 available from Shin-Etsu Chemical Co., Ltd) with a refractive index of 1.51 to form a sealing layer 31 having a semi-elliptic shape. The thickness of the transparent silicon resin (distance from the surface of the optical element to the surface of the transparent silicon resin) was about 0.5 mm. The transparent adhesive layer 5 was sprayed, with a thickness of about 5 μm, onto the surface of the sealing layer 31 using a mask to prevent the transparent adhesive from being attached to another part. Before the transparent adhesive layer 5 was dried, acrylic beads with a diameter of about 30 μm and a refractive index of 1.50 were pressed against the layer, so that they were attached to cover the surface of the transparent silicon resin with no space therebetween. A lighting unit 10 shown in FIG. 6 was thereby manufactured.

The lighting device 20 which was similar to that of Example 1 was manufactured using the lighting unit 10, and its luminance characteristics were measured.

Figure 7:
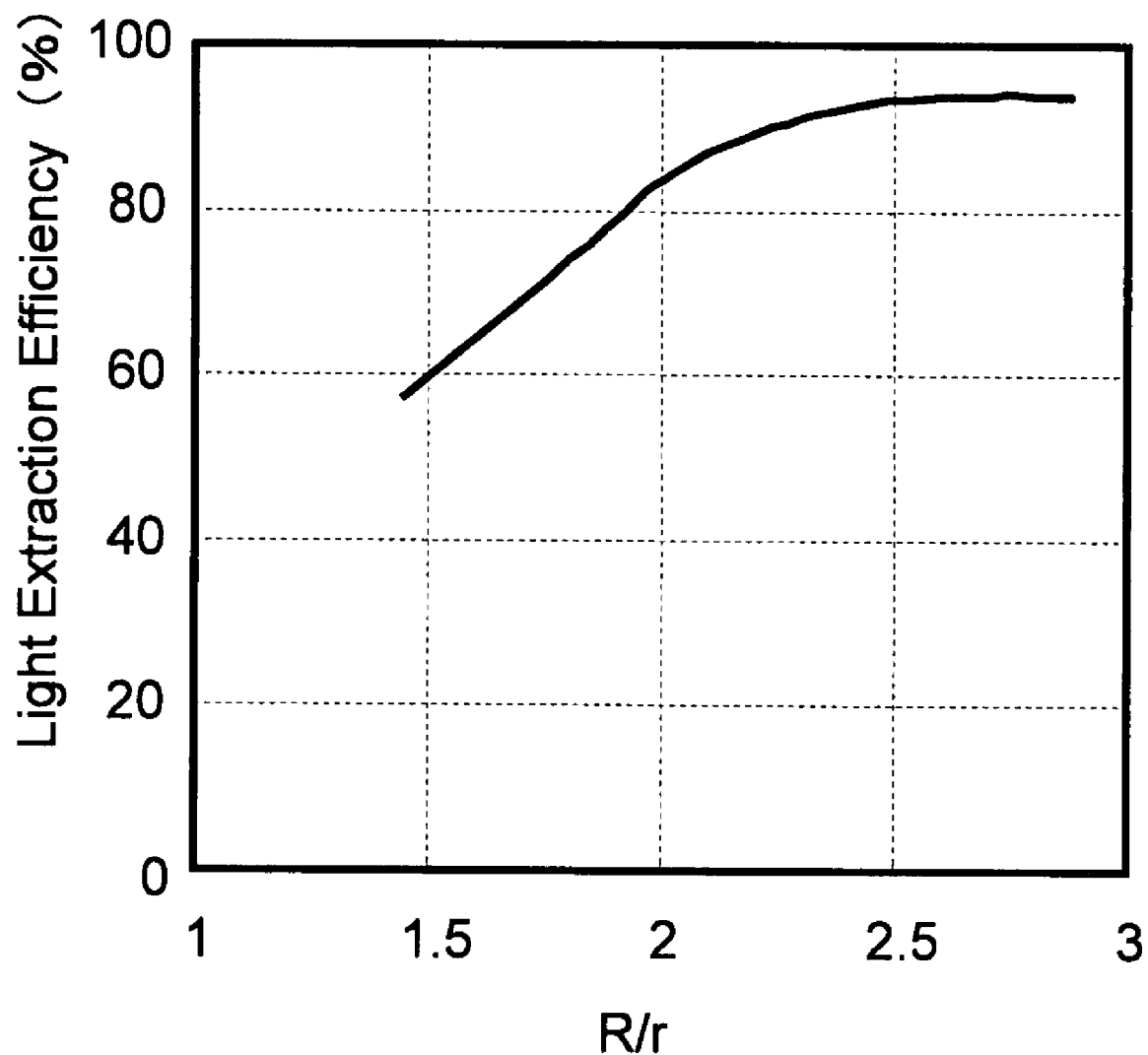
FIG. 7 is a graph showing the light extraction efficiency in a lighting device according to Example 1.

FIG. 7 shows the R/r dependence of the efficiency to extract LED light to the outside in the lighting device 20 which is manufactured in Example 1. As shown in FIG. 1B, R is a radius of the hemispherical lens structure 3, and r is a radius of the formation area of the light emitting element 2. The solid line in the graph of FIG. 7 indicates the measurement result of the efficiency of extracting LED light to the outside in Example 1. If R/r is smaller than 1.8, the light extraction efficiency falls below 80% and decreases sharply. In other words, the light extraction efficiency improves by placing the light emitting elements 2 in close proximity to the focal point of the lens structure 3.

Further, the color when cutting 50 percent of Green LED power from the power for producing white was magenta, and the color when cutting 50 percent of Blue LED power was orange.

Table 1 shows the color uniformity ($\Delta UV$) and the light extraction efficiency of the lighting device 20 which is manufactured with R/r=2.2 in Examples 1 to 4 and Comparative example 1. In the lighting device of Examples, R/r>1.8 is satisfied. Therefore, the direction of the light emitted from the light emitting element is largely inclined by the translucent spherical particles 4, so that three kinds of wavelengths light are mixed enough to be uniform, resulting in that the value of $\Delta UV$ is as low as less than 0.005. On the other hand, in Comparative example 1 where there is no translucent spherical particle 4, three colors of R, G and B are separated, resulting in a large $\Delta UV$ value. Further, although the light extraction efficiency exceeds 80% in each Example and Comparative example 1 because the light emitting elements 2 are gathered in close proximity to the focal point of the lens structure 3, the light extraction efficiency is low in Comparative example 2 because the lens structure 3 is not a hemispherical shape.

TABLE 1

| | Color uniformity ($\Delta UV$) | Light extraction efficiency |
|---|---|---|
| Example 1 | 0.0044 | 93.3% |
| Example 2 | 0.0041 | 92.2% |
| Example 3 | 0.0042 | 92.5% |
| Example 4 | 0.0092 | 88.5% |
| Comparative example 1 | 0.0542 | 94.3% |
| Comparative example 2 | 0.0140 | 56.1% |

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A lighting device comprising:
   a plurality of self-luminous elements formed on a single substrate and emitting different wavelengths of light from each other;
   a hemispherical lens structure formed on the single substrate to cover the self-luminous elements; and
   a plurality of translucent spherical particles covering a surface of the lens structure,
   wherein R/r>1.8 is satisfied when the self-luminous elements are placed in a circular area having a radius of r and the lens structure has a radius of R, and
   wherein the lens structure is a solid structure composed of resin material.

2. The lighting device according to claim 1, wherein a particle size distribution of the translucent spherical particles has two or more peaks.

3. The lighting device according to claim 2, wherein a minimum peak value of the particle size distribution is ½ or lower relative to a maximum peak value of the particle size distribution.

4. The lighting device according to claim 1, wherein the translucent spherical particles are formed in double layers.

5. The lighting device according to claim 1, wherein the translucent spherical particles are made of resin or glass.

6. The lighting device according to claim 1, wherein the self-luminous elements are composed of at least three kinds of elements emitting red, green and blue light.

7. The lighting device according to claim 1, wherein the self-luminous elements are placed in close proximity to a focal point of the lens structure.

8. A display apparatus comprising the lighting device according to claim 1 as a backlight.

9. A lighting device comprising:
   a plurality of self-luminous elements formed on a single substrate and emitting different colors of light from each other;
   a hemispherical lens structure formed on the single substrate to cover the self-luminous elements; and
   a plurality of translucent spherical particles covering a surface of the lens structure,
   wherein a given color of light is emitted,
   wherein R/r>1.8 is satisfied when the self-luminous elements are placed in a circular area having a radius of r and the lens structure has a radius of R, and
   wherein the lens structure is a solid structure composed of resin material.

10. The lighting device according to claim 9, wherein the given color of light is a mixture of different colors of light emitted from the plurality of self-luminous elements.

* * * * *